(12) United States Patent
Brindel et al.

(10) Patent No.: US 8,954,618 B2
(45) Date of Patent: Feb. 10, 2015

(54) METHOD FOR ACTIVATING CARD WITHIN A COMMUNICATION NETWORK

(75) Inventors: Patrick Brindel, Nozay (FR); Annalisa Morea, Nozay (FR)

(73) Assignee: Alcatel Lucent, Boulogne-Billancourt (FR)

( * ) Notice: Subject to any disclaimer, the term of this patent is extended or adjusted under 35 U.S.C. 154(b) by 48 days.

(21) Appl. No.: 13/514,702

(22) PCT Filed: Dec. 15, 2010

(86) PCT No.: PCT/EP2010/069728
§ 371 (c)(1),
(2), (4) Date: Jul. 31, 2012

(87) PCT Pub. No.: WO2011/080077
PCT Pub. Date: Jul. 7, 2011

(65) Prior Publication Data
US 2012/0311358 A1 Dec. 6, 2012

(30) Foreign Application Priority Data
Jan. 4, 2010 (FR) ..................... 10 50001

(51) Int. Cl.
*G06F 3/00* (2006.01)
*H04J 14/02* (2006.01)
*H05K 7/18* (2006.01)

(52) U.S. Cl.
CPC ............... *H04J 14/02* (2013.01); *H05K 7/186* (2013.01)
USPC .......................................... 710/8

(58) Field of Classification Search
None
See application file for complete search history.

(56) References Cited

U.S. PATENT DOCUMENTS

| 6,915,036 | B2* | 7/2005 | Bhalla et al. ............... 385/24 |
|---|---|---|---|
| 2003/0081281 | A1 | 5/2003 | Decusatis et al. |
| 2004/0258408 | A1* | 12/2004 | Ramaswami et al. .......... 398/50 |
| 2005/0191056 | A1* | 9/2005 | Coffey ............ 398/79 |
| 2006/0233204 | A1* | 10/2006 | Pomaranski et al. ......... 370/535 |
| 2006/0276164 | A1* | 12/2006 | Allen ............ 455/347 |
| 2007/0285910 | A1 | 12/2007 | Eshel |
| 2009/0196621 | A1* | 8/2009 | Chen ............ 398/115 |
| 2009/0313390 | A1* | 12/2009 | Ahuja et al. ............ 710/2 |
| 2012/0271978 | A1* | 10/2012 | Ahuja et al. ............ 710/301 |

OTHER PUBLICATIONS

Norme Internationale CEI IEC 297-2 Premiere Edition; 1982, XP002608867; Retrieved from the Internet: URL:http://ph-dep-ese.web.cern.ch/ph-dep-ese/crates/standards/iec60297-2.pdf [retrieved on Nov. 10, 2010].

* cited by examiner

*Primary Examiner* — Elias Mamo
(74) *Attorney, Agent, or Firm* — Carmen Patti Law Group, LLC (57) ABSTRACT

A method for activating a card within a communication network, making it possible to minimize the power consumption cost of putting the card into effect. The method consists of seeking out, and activating as a priority, cards which are located in already-activated receptacles. A receptacle may be a tray or cabinet in a predetermined search range corresponding to one or more nodes of said communication network.

8 Claims, 6 Drawing Sheets

METHOD FOR ACTIVATING CARD WITHIN A COMMUNICATION NETWORK

TECHNICAL FIELD

The invention pertains to the field of telecommunication devices organized in the form of modular structures comprising receptacles and cards housed in these receptacles. More specifically, the invention pertains to the activation of functional cards within a communication network. It may, for example, be a Wavelength Division Multiplexing (WDM) optical communication network. The invention pertains more particularly to the power consumption of these networks' equipment.

BACKGROUND

Standards such as the IEC 297-2 standard have for several decades defined the mechanical structure of cabinets made up of bays and trays containing cards. More recently, more specific standards for this equipment have been proposed, such as for telecommunication network cabinets. For example, this is true of the ATCA (Advanced Telecommunications Computing Architecture) standard, which defines both mechanical parameters and some cabinet control elements. These standards were introduced to enable interoperability and a reduction in manufacturing costs compared to a prior situation whereby each manufacturer designed its cabinets independent of any standard. The definition of cabinet standards currently affects a large variety of equipment such as communication network elements and data centers, whether they are for civilian, military, or research applications, to give a few examples.

SUMMARY

According to one embodiment, the invention provides a method for activating a card within a communication network, comprising the steps consisting of receiving a mission request relating to said communication network, searching within a search parameter comprising multiple receptacles for one or more cards capable of fulfilling said mission, activating a capable card within an already-activated receptacle if there is one, or if there are no capable cards within an already-activated receptacle and if there is a capable card in a non-activated receptacle, activating said card in a non-activated receptacle and also activating said receptacle.

Advantageously, the method comprises the step of defining said search parameter as a function of the switching capacity of a node of said network or on physical parameters relating to the propagation of signals over links connecting nodes of said network.

Preferentially, the method comprises the step of transmitting a message indicating an inability to fulfill said mission if there are no capable cards.

Additionally, the method comprises the step of identifying the activated receptacles that comprise the most activated cards and activating a card capable of fulfilling said mission located within (one of) the receptacle(s) containing the most activated cards, if there are multiple activated receptacles comprising a capable card.

Advantageously, a receptacle used within the method comprises a tray or a bay or a cabinet.

Preferentially, the range may be selected from the group consisting of a cabinet containing trays, a bay containing trays, a row of cabinets containing trays, a room containing a row of cabinets equipped with trays, or a room containing a row of bays containing trays.

Advantageously, the range used within the method comprises one or more switching nodes of said network.

The method may be used in a WDM optical network.

The method may be used for a mission selected from the group consisting of converting an optical signal into another optical signal, converting an optical signal into an electrical signal, or converting an electrical signal into another electrical signal.

The invention further proposes a control device for activating a card within a communication network, the control device comprising a communication module capable of receiving a mission request relating to said communication network, a search module capable of searching within a predetermined search range comprising one or more receptacles for one or more cards capable of fulfilling said mission, and an activation module capable of activating a card in an already-activated receptacle, if there is one, and if there are no capable cards in any already-activated receptacles, and there is a capable card in a non-activated receptacle, of activating a card within said non-activated receptacle and also activating said receptacle.

Preferentially, the control device is capable of sending a message indicating an inability to fulfill said mission if there are no capable cards.

Advantageously, the device searches for cards in a range whose receptacles comprise a rack or a bay or a cabinet.

It is possible for the control device to search within a search range in the group consisting of a cabinet containing trays, a rack containing trays, a row of cabinets containing trays, a room containing a row of cabinets equipped with trays, or a room containing a row of racks equipped with trays.

The control device may also search within a search range containing multiple nodes of an optical access network or an optical metropolitan network or a long-distance optical network, or an ultra-long-distance optical network The IEC 297-2 standard mentioned above defines the mechanical parameters of cards, trays, bays, cabinets, rows of cabinets, and rows of bays. It does not specify how many of these elements there are nor how to use them, because they must be adapted to the application in question. For example, the IEC 297-2 standard does not specify, at a given moment in the use of a telecommunication device within a WDM network, which cards, trays, cabinets, or rows of cabinets must be running. Neither does it specify in which nodes or in which set of nodes the cards that are running must be located in.

One problem at the basis of the invention is reducing the power consumption of the communication networks' elements.

Some of the aspects of the invention derive from the observation that the cards that a network operator has are generally powered on, even if they are not being used. Some of these cards could therefore temporarily be powered off.

One idea at the basis of some aspects of the invention is that nonetheless, optimally reducing consumption cannot be obtained only by powering off the cards which are not being used. This is because the power consumption must be considered to be a set that includes not only the cards' consumption, but also that of the cabinets' trays or those of the rows of cabinets. Thus, it is advantageous to preferentially turn off cards that are not being used which are located within the same tray. Thus, it may occur that at a certain time all of the cards in a tray are off, thereby making it possible to turn off the tray. This is because a tray consumes power as soon as it turns on one of the cards that it contains. The power consumed by the tray is, for example, that of its cooling system.

Likewise, another idea at the basis of the invention is that it is preferable to turn off cards and trays contained within a single cabinet whenever possible. This increases the likelihood that all of the cards and trays in a cabinet will be off simultaneously, thereby making it possible to turn the cabinet itself off.

Thus, an optimized policy for turning off the cards must make it possible to increase the number of trays, cabinets, or rows of cabinets that are off, thereby optimizing power savings.

Another idea at the basis of the invention is that the policy of activating or turning off cards must be as simple as possible, particularly avoiding the use of consumption measurements and tests that would be too complex and costly to implement.

Another idea at the basis of the invention is that the solution found for the problem of electrical power consumption may not be dependent on the functions of the cards, cabinets, or rows of cabinets. For example, these functions may consist of processing solely electrical signals, or solely optical signals, or of processing both electrical and optical signals.

The invention will be better understood, and other purposes, details, characteristics, and advantages thereof will become more clearly apparent upon examining the following description of multiple particular embodiments of the invention, which are given only by way of illustrative and non-limiting examples, with reference to the attached drawings.

DETAILED DESCRIPTION

Figure 1:
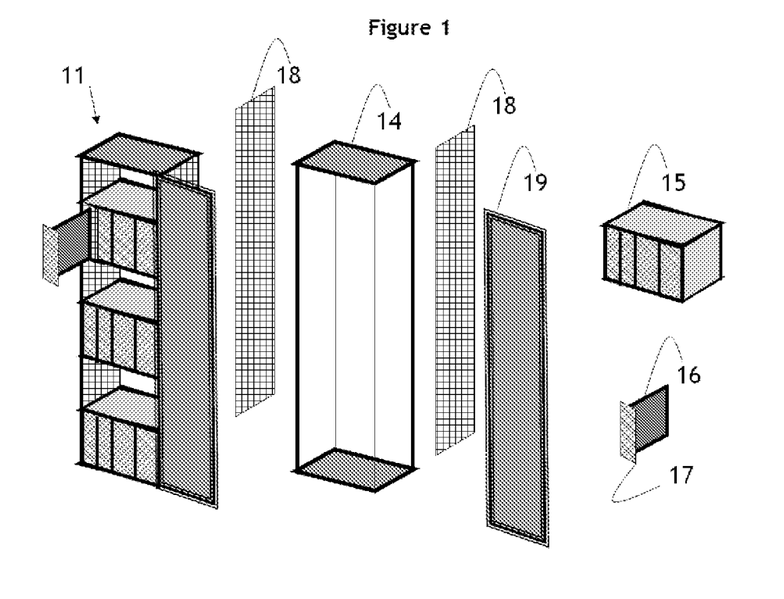
FIG. 1 is a functional schematic depiction of the elements of the cabinet containing optical and electronic cards.

FIG. 1 schematically depicts mechanical structures used to support electronic and/or optical equipment. The person skilled in the art is familiar with these mechanical structures used in laboratories, whose denominations are defined by standards. The definitions that will be used in this request are those proposed by the international standard IEC 297-2. It is possible that the vocabulary used in order standards may slightly differ, in particular due to translations between French and English. These vocabulary differences, however, are minor for the person skilled in the art, who has full knowledge of the general structure of these mechanical structures used to contain electronic or optical equipment.

According to the international IEC 297-2 standard, an electronic and/or optical cabinet is built from a bay 14, removable panels 18, a door 19, and trays 15. The trays 15 comprise cards 16 equipped with panels 17. The bays 14 are independent, freestanding structures that may be used alone or associated with other bays or fixed structures of racks, in order to constitute a row of equipment. A rack is a metal structure without a door or covering. A bay 14 may or may not have a base, feet, rollers, etc., depending on the requirements of the user, the mobility, and the load to move. A cabinet is a bay with doors or removable panels on one or more sides, depending on the application. The cabinet or bay may contain vertical elements, which panels may be fixed onto.

In practice, the structure of the trays may vary depending on the application. For example, some trays may possess only a single plan shared by all the cards. However, a better equipment cost is generally achieved by modular tray structures in which each card 16 possesses a panel 17 which is specific to it, with all of these panels forming the front face of the tray. The assembly made up by a card 16 and its front face 17 is sometimes called the blade. The cards may contain electronic and/or optical elements. A card may just as easily be constructed from an assembly made up of a motherboard and one or more daughterboards. For example, the PICMG 3.0/ATCA standard defines card structures in mezzanine tiers. Other card structures are possible.

In this request, a receptacle will be the term used for a structural element that may contain multiple cards. A receptacle may therefore be composed, for example, of a tray or a cabinet, or trays in a cabinet, or trays in bays. The embodiments outlined hereafter use cabinets, but it would be possible to outline embodiments using bays without doors 19 or removable panels 18. A receptacle may also be made up of row of cabinets or bays that share a common electrical consumption need, for example, a common ventilation system. For example, this will be true if a row of cabinets is located in a dedicated room equipped with its own ventilation system.

Figure 2:
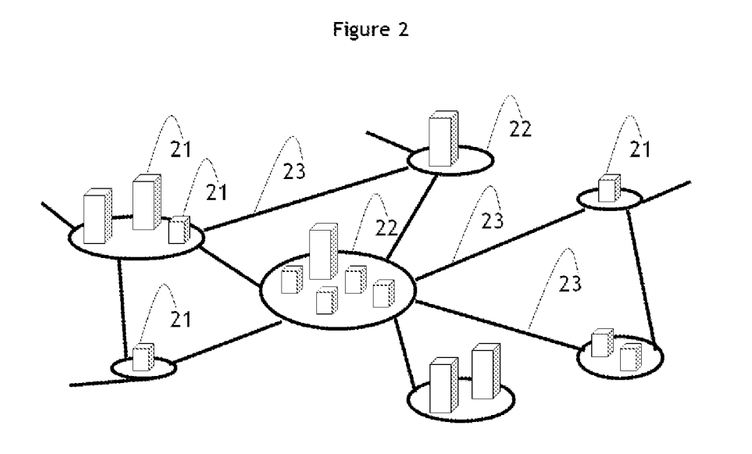
FIG. 2 is a schematic depiction of an optical communication network comprising multiple cabinets of the type described by FIG. 1.

FIG. 2 schematically depicts an optical communication network. This network comprises network nodes 22 connected by links 23. The links 23 are made up of one or more optical fibers. The network nodes 22 may contain one or more cabinets 21 comprising optical and/or electronic cards. The cabinets located within a single node may be different in their structure and their function. The cabinets located in different nodes may also be different in their structure and their function.

Figure 3:
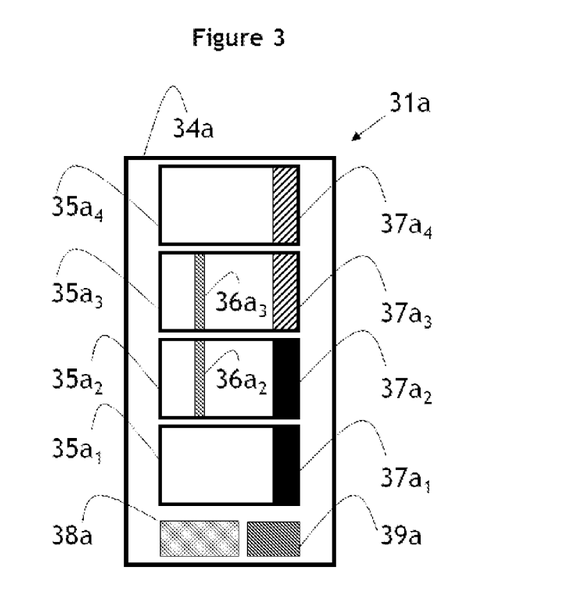
FIG. 3 is a diagram of steps of a method for activating a card according to one embodiment of the invention, which may be implemented within a cabinet of FIG. 1 or 2.
Figure 4:
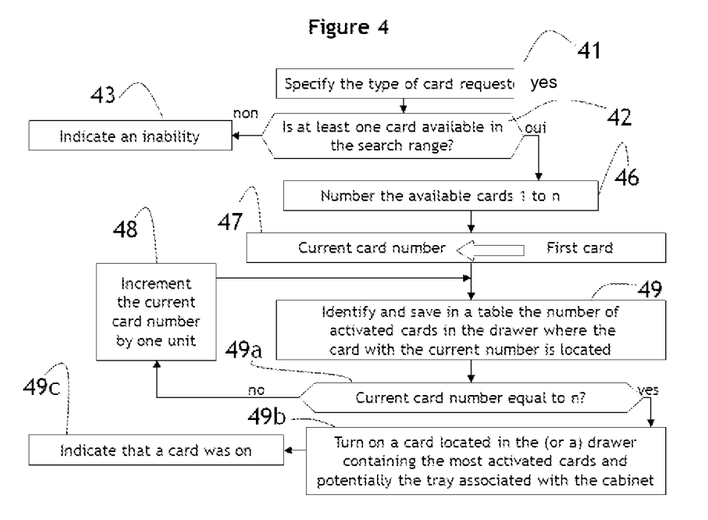
FIG. 4 is a decision flowchart related to FIG. 3.

With reference to FIGS. 3 and 4, we will now describe a first embodiment of activating a cabinet 34*a* comprising two equipment optical cards 36$a_2$ and 36$a_3$. Here, "equivalent optical cards" refers to cards which can both fulfill the same mission within the optical network of FIG. 2. If the cards can fulfill multiple missions, they may be considered equivalent for at least one of those missions.

FIG. 3 corresponds to an initial state in which both cards 36$a_2$ and 36$a_3$ are not both running, and in which the question is asked which one it is preferable to activate so as to minimize the power consumption of the cabinet 34*a*. In what follows, is assumed that a board is in an activated state when at the moment in question, is actively participating in the operation of the network, meaning that it has fulfilled the function, also known as a mission, for that network. Such a card is deactivated when it does not or no longer takes part in the operation of the communication network in question.

The fact that a card is taking part in the operation of the network may be likened to be a convention. For example, in one embodiment, it may be assumed that a card is taking part in the operation of the network if and only if deactivating that card has an effect on other nodes of the network or on the traffic carried by the network. In another embodiment, it may be assumed that a card is taking part in the network even if activating it has no effect on the general operation of the network. For example, if the card corresponds to a data viewing system within a node, the operation of that local viewing system is not critical for the general operation of the network.

At that initial moment, other cards not depicted in FIG. 3 may be found in the cabinet 31a, some activated and others not. The number of cards not depicted in FIG. 3 may be as high as the number of cards that the cabinet 31a may contain. The cabinet's 34a activated cards consume associated electrical power. Non-activated cards do not consume electrical power. In the example shown in FIG. 3, we assume for simplicity's sake that a card's power consumption is independent of that of the other cards.

In one embodiment, both cards $36a_2$ and $36a_3$ may have a transponder function for transforming a first optical signal over a 1.3 μm wavelength channels into one electrical signal, then transforming that electrical signal into an optical signal over a WDM (wavelength division multiplexing) channel of around 1.55 μm. The 1.3 μm signal on a wavelength channel may be routed to either of the two cards $36a_2$ and $36a_3$, by means of the an input optical cross-connect not depicted in FIG. 3. Likewise, an output optical cross-connect not depicted in FIG. 3 makes it possible to retrieve either the optical signal over a WDM channel of around 1.55 μm from whichever of the two cards $36a_2$ et $36a_3$ is being used. The transponder function just described therefore comprises a conversion of an optical signal into an electronic signal, followed by a conversion of an electrical signal into an optical signal. The transponder card and the cross-connects contribute to the switching capacity of the node in which they are located.

It is possible to choose a second example embodiment in which the function of the cards $36a_2$ and $36a_3$ is to transform an optical signal into another optical signal, as may be the case for cards comprising optical amplifiers made up of doped optical fibers. The cards comprising optical amplifiers contribute to the regeneration capacity of optical signals of the network within the node containing these optical cards.

It is also possible to choose a third embodiment where the function of the cards $36a_2$ and $36a_3$ is to transform an electrical signal into another electrical signal, for example cards providing an electrical signal multiplexing function.

The card $36a_2$ is located in a tray $35a_2$ equipped with a ventilation element $37a_2$. The card $36a_3$ is located in a tray $35a_3$ equipped with a ventilation element $37a_3$. The bay 34a of the cabinet 31a contains the two trays $35a_2$ and $35a_3$ as well as two other trays $35a_1$ and $35a_4$. The tray $35a_1$ comprises a ventilation element $37a_1$. The tray $35a_4$ comprises a ventilation element $37a_4$. The cabinet 34a further comprises a cabinet ventilation element 38a and a control device 39a. The ventilation elements $37a_1$, $37a_2$, $37a_3$, $37a_4$ provide the specific ventilation of the corresponding trays $35a_1$, $35a_2$, $35a_3$, $35a_4$. The cabinet ventilation element 38a ensures the general ventilation of the cabinet 31a. The control device 39a controls the local operation of the cabinet 31a, for example with respect to the electrical power supply and heat regulation. The control device 39a also controls the operation of the cards contained within the cabinet 31a, in relationship dimensions which are assigned to them by the network manager depicted in FIG. 2. The control system 39a therefore communicates with the network manager by means of communication protocols, for example RSVP (Resource Reservation Protocol) and GMPLS (Generalized Multiprotocol Label Switching) and other protocols.

FIG. 3 depicts in black the ventilation elements $37a_1$ and $37a_2$ to show that they are operating at the moment in question in FIG. 3. The ventilation elements $37a_3$ and $37a_4$ are depicted as dashed lines to show that they are not operating at the moment in question in FIG. 3.

If the electrical power cost needed to activate the card $36a_2$ from the initial moment when the two cards $36a_2$ and $36a_3$ are inactive is examined, this cost is roughly equal to the electrical operating cost of the card $36a_2$ by itself. This is because, in the initial state, the ventilation element $37a_2$ of the tray $35a_2$ containing the card $36a_2$ is already in an operating state as depicted in black in FIG. 2. If on the other hand the electrical power cost needed to activate the card $36a_3$ is examined, this cost is roughly the same as the power costs of activating the card $36a_3$ and the electrical power cost needed to activate the ventilation element $37a_3$ of the tray $35a_3$. This is because at the moment when the choice must be made to activate the card $36a_2$ and $36a_3$, the ventilation element $37a_3$ is inactive, as depicted in dashes in FIG. 3.

FIG. 4 schematically depicts a flow chart that makes it possible to select which of the equivalent cards available in a cabinet 31a must be activated so as to minimize the electrical power consumption. The flowchart in the Figure may be used regardless of the number of equivalent available cards, as this number may or may not be zero. The number of equivalent available cards may in particular be equal to two, as depicted in FIG. 3 with cards $36a_3$ and $36a_4$.

In step 41, the control device 39a receives from a network manager a request specifying the type of card needed by the network. The request may, for example, be meant to increase the capacity of a node or to perform a signal regeneration function. At the moment when a request is received, it may be necessary to implement a card whose mission will be to ensure the transponder function as previously described. In step 42, the control device 39a studies whether the search range 31a contains at least one available card, meaning that it is not already used and that it is capable of fulfilling the required mission.

If this is not the case, the control device 39a sends in step 43 a message to the network manager to indicate that it is impossible to assign an appropriate card within the chosen range. The examined range here is the one that is under the control of the control device 39a, meaning the cabinet 35a and the set of cards and other elements that it contains.

If on the other hand the control device 39a were to detect, within the search range made up by the cabinet, at least one appropriate card which is not being used, it identifies within the cabinet 31 the set of available equivalent cards in the cabinet 31a, which it numbers 1 to n in step 46, n being a non-zero whole number. In step 47, the control device takes as the initial current card number the number of the first equivalent card. In step 49, the control device identifies and saves within a table the number of activated cards located in the tray where the card with the current number is found. In step 49a, the control device verifies whether the current card number is equal to n. If it is not, in step 48, it moves up the current card number by one unit. Next, it carries out steps 49, 49a and 48 as necessary until step 49a, when it sees that the current card number is equal to n.

The control device then decides in step 49b to activate a card located within the tray or a tray containing the most activated cards. Start-up consists of turning on, i.e. powering on, the available card, which therefore begins consuming electrical power. It may be necessary to activate the ventilation system of the tray that contains that card, for example if the card is the first to be turned on at that moment for that tray. Once the card has been powered on, an information exchange according to one or more necessary protocols, for example RSVP, GMPLS or other protocols, takes place between the activated card and other elements of the communication network so as to lead to that card becoming functionally started up.

The control device then proceeds to step 49c to indicate that a card has been activated.

The advantage of a flow chart as depicted in FIG. 4 is that it makes possible to keep trays in the cabinet containing few active cards. This makes it possible to statistically increase the possibility of deactivating some trays, and thereby to save on their power consumption, and in particular that of their ventilation system 37a. For example, this is true if in a later moment in the life of the network, the network manager indicates to the control device 39a that a few cards remaining active in one of the drawers comprising the fewest activated cards may be deactivated.

Figure 5:
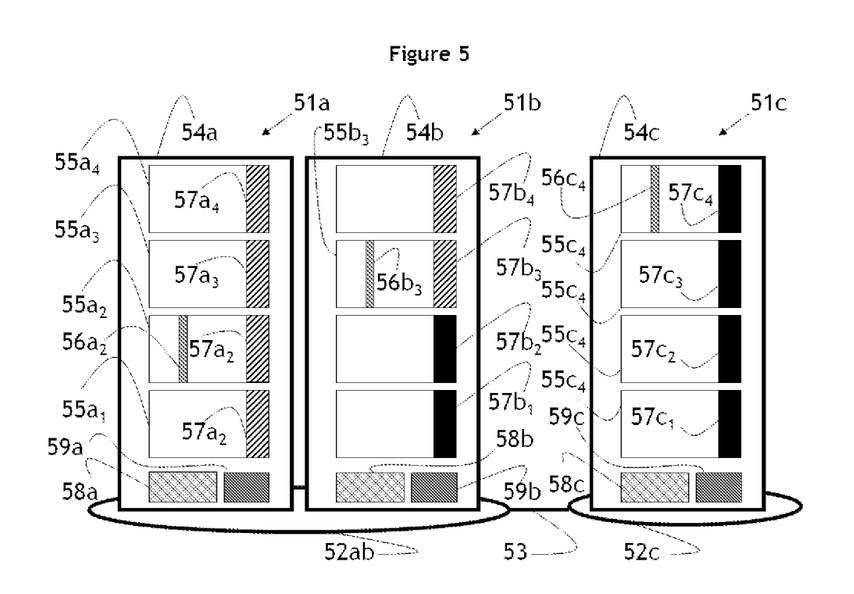
FIG. 5 is a schematic depiction of a second example of activating an optical card within the cabinet related to FIGS. 1 and 2.
Figure 6:
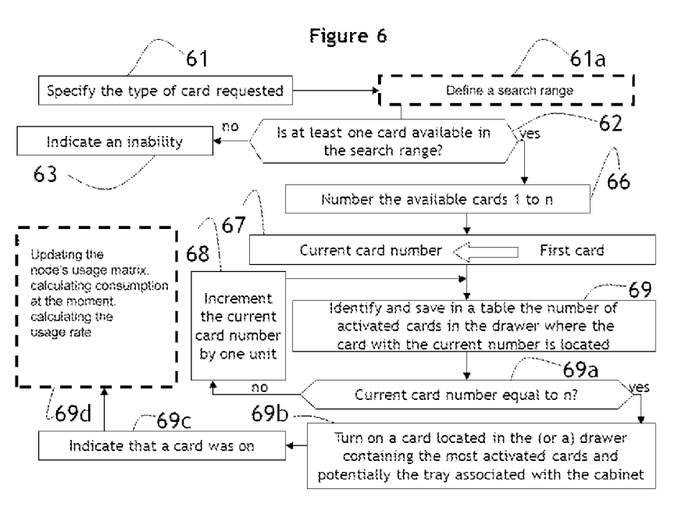
FIG. 6 is a decision flowchart related to FIG. 5.

With reference to FIGS. 5 and 6, we will now describe a second embodiment of the activation of three electronic cabinets 51a, 51b, and 51c comprising three optical equivalent cards $56a_2$ and $56b_3$ and $56c_4$. The reference figures in FIG. 5 correspond to those in FIG. 3 increased by 20. And thus, FIG. 5 shows bays shows bays 54a, 54b, and 54c, trays $55a_1$, $55a_2$, $55a_3$, $55a_4$, $55b_1$, $55b_2$, $55b_3$, $55b_4$, $55c_1$, $55c_2$, $55c_3$, $55c_4$, ventilation elements 58a, 58b, 58c, and control devices 59a, 59b, 59c.

Hereafter, it is assumed for simplicity's sake that only the control device 59a orders the elements of the cabinets 54b and 54c via control devices 59b and 59c. The control device 59a is therefore the master and the control devices 54b and 54c are slaves.

It is also assumed that 40 inactive cabinet to be activated, that cabinet's control device must remain in standby mode. The control device 59a may thereby order the control devices 59b and 59c to respectively activate the cabinets 51b and 51c, toggling these cabinets' deactivated states.

The cabinets 54a and 54b are located in the same network node 52ab; the cabinet 54c is located in a network node 52c. The network nodes 52ab and 52c are connected by an optical link 53, for example, an optical fiber. For the sake of instruction, FIG. 5 only shows two nodes 52ab and 52c. Naturally, the cabinets may be located in a greater number of nodes, and it would be possible to outline an example comprising more than three cabinets and more than three equivalent optical cards. The distance between the nodes 52ab and 52c may be any distance. It may, for example, be several meters, or several kilometers, or even longer, for example hundreds of kilometers. This variety of distance is what is found, for example, in the storage area networks (or SANs), local area networks (or LAN's), access networks, metropolitan area networks, or long-distance or very-long-distance networks.

FIG. 5 depicts in black the ventilation elements $57b_1$, $57b_2$, $57c_1$, $57c_2$ $57c_3$ and $57c_4$ to show that they are operating at the moment examined in FIG. 5.

The ventilation elements are depicted as dashed lines $57a_1$, $57a_2$, $57a_3$, $57a_4$ $57b_3$ and $57b_4$ to show that they are not operating at the moment examined in FIG. 5.

FIG. 6 schematically depicts a flow chart which makes possible to select which among several equivalent cards within a network must be chosen to minimize the electrical power consumption. This flowchart may in particular be applied to the three equivalent charts as depicted in FIG. 5.

The flowchart depicting FIG. 6 uses the same digits as references as in FIG. 4, increased by 20. In particular, the description of the steps 41, 42, 43, 46, 47, 48, 49, 49a, 49b, and 49c applies by analogy to steps 61, 62, 63, 66, 67, 68, 69, 69a, 69b, and 69c.

In FIG. 5, the control device 59a plays the role of the control device 39a from FIG. 3. In particular, the control device 59a defines the search parameter of the equivalent available cards. This range is not solely limited to one cabinet as was the case in FIG. 4. In FIG. 5, the control device 59a is capable of including cabinets 51a, 51b, and 51c within the range that it examines.

If the cards 51a, 51b, and 51c are transponder cards, including the two cabinets 51a and 51b within the search range makes it possible to increase the switching capacity of node 52ab. The control device 59a may therefore take into account both the power consumption considerations of the equivalent cards and the switching capacity considerations of node 52ab.

If cards 51a, 51b et 51c are optical amplification cards, including the remote cabinet 51c in the search range makes it possible to choose between the nodes 52ab and 52c as network signal regeneration nodes. For example, the control device 59a receives an optical amplification request of a signal. Furthermore, the control device 59a is constantly receiving information about the network's physical parameters via REVP, GMPLS, and other protocols. If the physical parameters enable it, the controlled device may therefore activate the amplification card 56c4 located in a tray 55c4 whose fan 57c4 is already on. The control device 59a may therefore take into account both the physical tolerance considerations for regenerating signals, and the cards' electrical power consumption considerations.

The capacity that the control device 59a has to define search parameter that includes multiple cabinets in multiple nodes of the network is diagrammed by step 61a of FIG. 6. This step is not described in FIG. 4 because the search parameter of the control device 39c in FIG. 3 has been defined as the cabinet 31a.

If during step 69b the available cards are all in a non-activated tray, it will be necessary to select a tray to be activated. In one embodiment, this selection is made based on the activity rate of the various cabinets. One tray is chosen to be activated in the cabinet that contains the most activated trays.

The same holds true for the trays in the bays.

Likewise, during step 69b the available cards may be found in a tray of an inactivated cabinet in a row of cabinets. It will be necessary to select one tray in a cabinet to be activated. In one embodiment, this selection is made based on the activity rate of the various cabinet rows. One tray is chosen to be activated in a cabinet belonging to the (or a) row of cabinets which contains the most activated cabinets.

The same holds true for trays is bays organized into rows of bays.

FIG. 6 also outlines a step 69d which consists of updating the matrix for using the node(s), for example nodes 52ab and 52c in FIG. 5. It is possible to calculate the consumption of cards, trays, cabinets, bays, rows of cabinets or rows of bays, as well as their usage rates. This information is transmitted to the network manager by the control device 59a.

Although the invention has been described in connection with multiple specific embodiments, it is naturally not in any way limited to them, and comprises all technical equivalents of the means described, as well as their combinations, if said combinations fall within the scope of the invention.

The use of the verb "comprise" or "include" and their conjugated forms does not exclude the presence of elements or steps other than those set forth in a claim. The use of the indefinite article "a" or "an" for an element or step does not, unless otherwise stated, excluded the presence of a plurality of such elements or steps. Multiple means or modules may be depicted by a single hardware element. In the claims, any reference sign within parentheses should not be interpreted as limiting the claim.

The invention claimed is:

1. A method for activating a card with a communication network, comprising the steps of:
   receiving a mission request relating to said communication network,
   defining a search parameter as a function of a switching capacity of a node of said network or on physical parameters relating to a propagation of signals over links connecting nodes of said network,
   searching within a search range comprising multiple receptacles, for one or more cards capable of fulfilling said mission,
   prioritizing card activation by first activating a capable card within an already-activated receptacle when one exists, and
   if there are no capable cards within an already-activated receptacle and if there is a capable card in a non-activated receptacle, activating said capable card in said non-activated receptacle and activating said non-activated receptacle.

2. The method according to claim 1, wherein when there are multiple activated receptacles comprising a capable card, identifying the activated receptacle(s) comprising the most activated cards and activating a card capable of fulfilling said mission located within the receptacle(s) containing the most activated cards.

3. The method according to claim 1, wherein a receptacle comprises a tray or a bay or a cabinet.

4. The method according to claim 3, wherein the range is selected from the group consisting of the cabinet containing trays, the bay containing trays, a row of cabinets containing trays, a row of bays containing trays, a room containing a row of cabinets with trays and a room containing a row of bays containing trays.

5. The method according to claim 1, wherein the range comprises one or more switching nodes of said network.

6. The method according to claim 1, wherein said communication network is a wavelength division multiplexing (WDM) optical network.

7. The method according to claim 1, wherein said mission is selected from the group consisting of a conversion of an optical signal into another optical signal, a conversion of an optical signal into an electrical signal, and a conversion of an electrical signal into another electrical signal.

8. A control device configured to activate a card within a communication network, comprising:
   a communication module configured to receive a mission request that relates to said communication network,
   a search module configured to define a search parameter as a function of a switching capacity of a node of said network or on physical parameters relating to a propagation of signals over links connecting nodes of said network and to search within a predetermined search range comprising one or more receptacles for one or more cards that can fulfill said mission,
   an activation module configured to
      prioritize card activation by first activating a card within an already-activated receptacle when one exists, and
      if there is no capable card within an already-activated receptacle, and if there is a capable card in a non-activated receptacle, activating said capable card within said non-activated receptacle and activating said non-activated receptacle.

* * * * *